US008022776B2

(12) United States Patent
Chang et al.

(10) Patent No.: US 8,022,776 B2
(45) Date of Patent: Sep. 20, 2011

(54) ORIGAMI CASCADED TOPOLOGY FOR ANALOG AND MIXED-SIGNAL APPLICATIONS

(75) Inventors: Mau-Chung Frank Chang, Los Angeles, CA (US); Daquan Huang, Dallas, TX (US); Tim Richard LaRocca, Redondo Beach, CA (US)

(73) Assignee: The Regents of the University of California, Oakland, CA (US)

( * ) Notice: Subject to any disclaimer, the term of this patent is extended or adjusted under 35 U.S.C. 154(b) by 538 days.

(21) Appl. No.: 11/997,354

(22) PCT Filed: Aug. 2, 2006

(86) PCT No.: PCT/US2006/030383
§ 371 (c)(1),
(2), (4) Date: Jan. 30, 2008

(87) PCT Pub. No.: WO2007/019281
PCT Pub. Date: Feb. 15, 2007

(65) Prior Publication Data
US 2008/0231383 A1    Sep. 25, 2008

Related U.S. Application Data

(60) Provisional application No. 60/705,872, filed on Aug. 4, 2005, provisional application No. 60/705,873, filed on Aug. 4, 2005.

(51) Int. Cl.
*H01L 23/66* (2006.01)
*H03J 7/02* (2006.01)

(52) U.S. Cl. .............. 331/36 L; 331/114; 331/117 R; 331/117 FE; 331/167; 330/55; 330/77; 330/79; 330/81; 330/118; 330/119; 330/120; 330/122; 330/154; 330/165; 330/171; 330/255; 330/262; 330/276; 330/296; 323/355

(58) Field of Classification Search .................. 331/100, 331/108 R, 114, 117 R, 167; 330/55, 77, 330/79, 81, 118, 119, 120, 122, 154, 165, 330/171, 255, 262, 276, 296; 323/355
See application file for complete search history.

(56) References Cited

U.S. PATENT DOCUMENTS 4,535,304 A * 8/1985 Bura ............................ 330/300

(Continued)

OTHER PUBLICATIONS

Taiwan Intellectual Property Office, Patent Application No. 95128484, official action issued Dec. 27, 2010, non-English language document with English language translation of search report showing relevancy of references cited, and with English language version of claims examined, counterpart to U.S. Appl. No. 11/997,354, pp. 1-13.

*Primary Examiner* — Arnold Kinkead
*Assistant Examiner* — Richard Tan
(74) *Attorney, Agent, or Firm* — John P. O'Banion

(57) ABSTRACT

The present disclosure relates to coupled circuits and methods of coupling circuits having a power supply wherein a plurality of transistors are inductively coupled directly to the power supply for providing a single DC supply voltage directly to each of the plurality of transistors, and wherein a plurality of transformers have primary and secondary windings, the primary and secondary windings providing, at least in part, inductive loads for inductively coupling the plurality of transistors to the power supply, the plurality of transformers also providing an AC signal path for coupling neighboring ones of the plurality of transistors together.

16 Claims, 16 Drawing Sheets

U.S. PATENT DOCUMENTS

| | | | |
|---|---|---|---|
| 6,392,490 B1 | 5/2002 | Gramegna et al. | 330/296 |
| 6,566,963 B1 | 5/2003 | Yan et al. | 330/311 |
| 6,803,824 B2 | 10/2004 | Rategh et al. | 330/302 |
| 6,819,179 B2 | 11/2004 | Raja et al. | 330/285 |
| 7,005,930 B1 * | 2/2006 | Kim et al. | 331/46 |
| 7,136,764 B2 | 11/2006 | Adan | 702/65 |
| 7,375,598 B2 * | 5/2008 | Hung et al. | 331/117 FE |
| 2004/0027755 A1 * | 2/2004 | Hajimiri et al. | 361/91.1 |
| 2005/0118979 A1 * | 6/2005 | Langenberg et al. | 455/333 |
| 2007/0018739 A1 * | 1/2007 | Gabara | 331/167 |

* cited by examiner

ORIGAMI CASCADED TOPOLOGY FOR ANALOG AND MIXED-SIGNAL APPLICATIONS

CROSS REFERENCE TO RELATED APPLICATIONS

This application claims the benefit of U.S. Provisional Patent Application 60/705,873 filed Aug. 4, 2005 and hereby incorporates by reference U.S. Provisional Patent Application 60/705,873 filed Aug. 4, 2005. This application also claims the benefit of U.S. Provisional Patent Application 60/705,872 filed Aug. 4, 2005 and also hereby incorporates by reference U.S. Provisional Patent Application 60/705,872 filed Aug. 4, 2005.

The technology disclosed herein can utilize the technology disclosed in a PCT Patent Application entitled "Interleaved Three-Dimensional On-Chip Differential inductors and Transformers" for which The Regents of the University of California and Messrs. Daquan Huang and Mau-Chung F. Chang.

STATEMENT REGARDING FEDERAL RESEARCH

This invention was made with Government support of Grant No. N66001-04-1-8934, awarded by the U.S. Navy. The Government has certain rights in this invention.

TECHNICAL FIELD

This invention is related to cascode circuits which can be used in a number of low power supply and low power consumption applications as well as in relatively high power applications. But even when used in relatively high power applications, the circuit design disclosed herein provides improved power generation at lower supply voltages compared to prior art designs.

BACKGROUND OF THE INVENTION

Current technology trends favor low power supply voltages and low power consumption circuits. A cascode structure is widely used in analog and mixed-signal circuits. FIG. 1a shows a cascode circuit formed by N CMOS transistors 2 while FIG. 1b a cascode circuit formed by N bipolar transistors 4. Note the vertical serial arrangement of the transistors 2, 4 and their connection to the power supply at $V_{DD}$ and ground. Obviously, the maximum drop across any individual transistor 2, 4 will be much less than the difference between $V_{DD}$ and ground, so the transistors 2, 4 are not really being effectively utilized.

Cascode topologies are popular. A typical cascode is an arrangement of electronic active devices that combines two or more amplifier stages for increased output resistance and reduced parasitic capacitance, resulting in high gain with increased bandwidth. The cascode arrangement usually refers specifically to the combination of a transconductance amplifier stage with a current buffer stage.

The minimum supply voltage ($V_{DD}$ in the embodiment of FIGS. 1a and 1b) for an N stage cascode structure is $Nx(V_{gs}-V_{th})$ for CMOS transistors and $NxV_{BE(on)}$ for bipolar transistors. This constraint severely limits the applications for these circuits in low power and voltage applications as there is not enough headroom for signal swing due to supply voltage constraints.

A prior art power amplifier is discussed with reference to FIGS. 6a-6c. Expensive HEMTs made from relatively exotic (compared to silicon) semiconductor materials have been used in the circuit of FIG. 6a to form a power amplifier such as can be used in the final RF stage of a telecommunications device. Exotic HEMT devices tend to need complicated power supplies since the voltage needed tends to be higher than that used elsewhere in communication equipment employing such devices.

BRIEF DESCRIPTION OF THE INVENTION

The present invention uses transformer based "origami topology" (cascaded folding) topology is disclosed to overcome this low power supply bottle-neck, by allowing the supply voltage can be as low as $V_{gs}-V_{th}$ for MOS devices and $V_{BE(on)}$ for bipolar devices.

In accordance with one aspect of the present invention a DC bias path is separated from an AC signal path in a cascode design. Each circuit stage of the cascode design has its own DC path and is biased individually. Therefore the supply voltage can be as low $V_{gs}-V_{th}$ for MOS transistors and $NxV_{BE(on)}$ for bipolar transistors, yet with a relatively large AC dynamic range can be accommodated. The AC signal is coupled via transformers between stages.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

In one aspect the present invention provides a method of coupling circuits which includes (i) providing a power supply; (ii) providing a plurality of transistors which are inductively coupled directly to the power supply for providing a single DC supply voltage directly to each of the plurality of transistors, and (iii) providing a plurality of transformers having primary and secondary windings, the primary and secondary winding providing, at least in part, inductive loads for inductively coupling the plurality of transistors to the power supply, the plurality of transformers also providing an AC signal path for coupling neighboring ones of the plurality of transistors together.

In another aspect the present invention provides an analog amplifier having: at least one transformer with primary and secondary windings; at least one first transistor having current carrying electrodes coupled to a first potential of a power supply via at least a portion of the primary winding of the at least one transformer and to a second potential the power supply, a control electrode of the at least one first transistor providing an amplifier input, and at least one second transistor having current carrying electrodes coupled to the second potential of the power supply via the at least a portion of the secondary winding of the at least one transformer and to the second potential of the power supply via a load, a control electrode of the at least one second transistor being coupled to a DC bias voltage to thereby bias the at least one second transistor on, but not in saturation, An amplifier output occurs at or in association with a junction between a current carrying electrode of the at last one second transistor and the load.

In yet another aspect the present invention provides an amplifier comprising: a transformer with a center-tapped primary and a center-tapped secondary, the center-tapped primary being coupled to a first potential of a supply voltage and the center-tapped secondary being coupled to a second potential of the power supply; a first pair of transistors having current carrying electrodes coupled to the primary of the transformer and to the second potential of the power supply, control electrodes of the first pair of transistors providing amplifier inputs; a second pair of transistors having current carrying electrodes coupled to the secondary of the transformer and to the first potential the power supply via a load, control electrodes of the second pair of transistors being coupled to bias voltage for biasing the second pair of transistors into conduction, with an amplifier output occurring at or in association with a common junction between current carrying electrodes of the second pair of transistors and the load.

BRIEF DESCRIPTION OF THE FIGURES

FIG. 4b is a bipolar implementation of the circuit of FIG. 4a.

FIGS. 6a-6c show a prior art power amplifier (PA), FIG. 6a being a schematic diagram of a circuit including a power transistor with impedance matching networks while FIGS. 6b and 6c show the transistors characteristics.

FIG. 7b is a graph showing voltages within the circuit of FIG. 7a.

FIG. 7d depict time-domain voltage waveforms according to computer simulations of the circuit of FIG. 7a.

FIG. 8a is a schematic diagram of a differential version of the power amplifier of FIG. 7a.

FIG. 9b is a graph showing gains occurring stage by stage for the amplifier of FIG. 9a.

FIG. 10b describes the S-parameters of the transformer of FIG. 10a.

DETAILED DESCRIPTION OF THE PREFERRED EMBODIMENTS

Figure 2A:
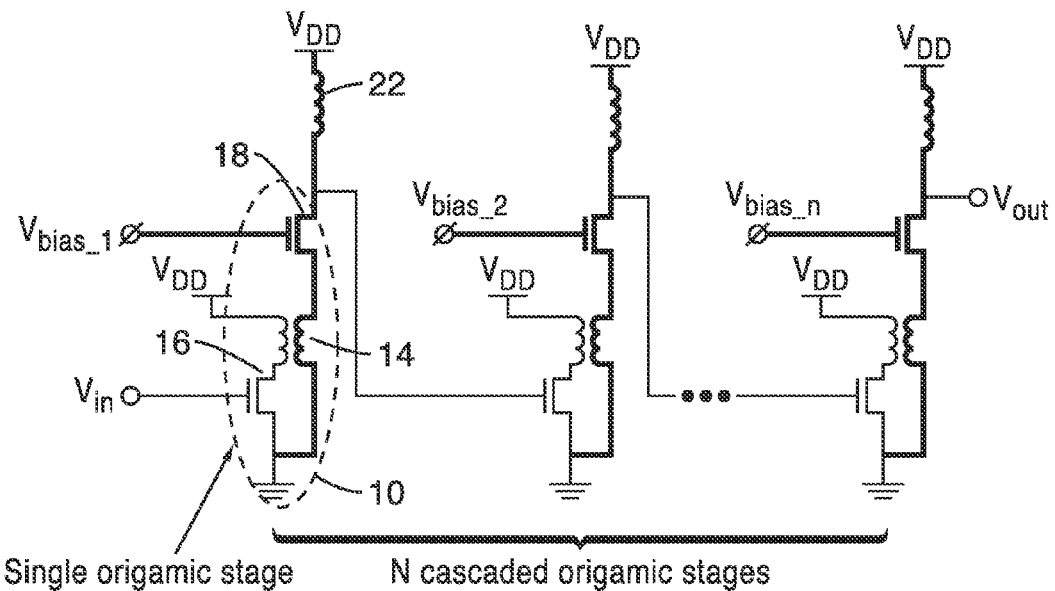
FIGS. 2a and 2b are schematic diagrams of cascode arrangements of MOS and bipolar transistors in accordance with the presently disclosed technology using a folded or origami topology, respectively.
Figure 2B:
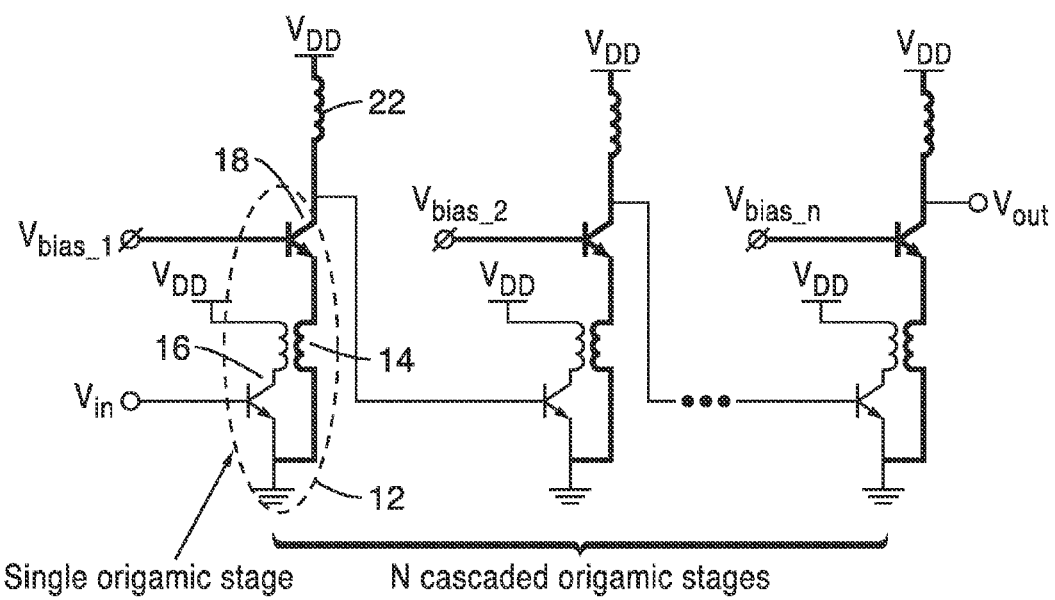

FIGS. 2a and 2b are schematic diagrams of cascode arrangements of MOS transistors and bipolar transistors in accordance with the presently disclosed technology using a folded or origami topology, respectively. In FIG. 2a the cascode arrangement includes N stages 10 each formed by MOS transistors. A single stage 10 is depicted in greater detail in FIG. 2c. Similarly, the cascode arrangement of FIG. 2b includes N stages 12 each formed by bipolar transistors. An embodiment of single stage 12 is depicted in greater detail in FIG. 2d.

The embodiments can be used in low power applications, such as Low Noise Amplifiers (LNAs), signal mixers, etc. However, these embodiments can also be used in relatively higher power applications such as power amplifiers (PAs) used in communication transmitters. In some applications a single stage will suffice. For example, in small signal applications, gains up to 23 dB have been realized in a single stage with a turns ratio of the transformer 14 in the 1:2 to 1:4 range.

The transformer 14 allows each transistor 16, 18 in a stage (See FIG. 2d for a MOS embodiment stage 10—the corresponding bipolar embodiment stage should be evident based on FIG. 2b) to be connected across the power supply (VDO and ground in this embodiment) via an inductive load, as opposed to be serially connected as in the prior art. The inventors refer to this technique as "folding" the circuit (or simply "origami") since the circuit is, in a sense, folded in such a way that each transistor can see the full power supply range as opposed to being stuck in the middle of some traditional cascode arrangement.

The turns ratio of the transformer 14 affects the gain of a stage and, in low signal applications, the turns ratio preferably falls in the 1:2 to 1:4 range. In higher power applications, the turns ratio will be less and is preferably about 1:1.

The transformers shown in the Figures generally have no polarity dots. This is because the polarity can be selected so that either the output of a stage is in phase with its input or is 180° out of phase with its input depending on how the polarity of the windings of the transformer are arranged.

Note that the DC bias path is separated from the AC signal path in this cascode design. The DC path is shown with a relatively wider line width to help differentiate it from the AC path in FIGS. 2a and 2b. Each circuit stage 10 or 12 has its own DC path and is biased individually. Therefore the supply voltage can be as low $V_{gs}$-$V_{th}$ for MOS transistors and $NxV_{BE (on)}$ for bipolar transistors, yet with a relatively large AC dynamic range. The AC signal is directly coupled between stages in this embodiment.

Figure 1A:
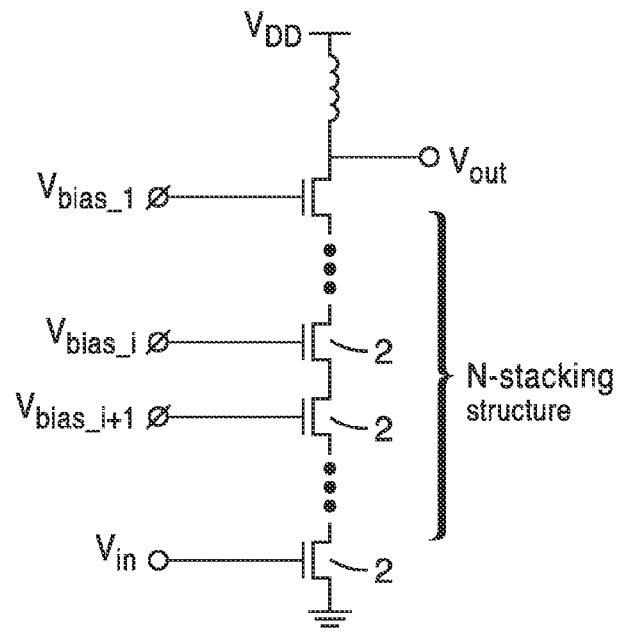
FIGS. 1a and 1b are schematic diagrams of prior art cascode arrangements of MOS and bipolar transistors, respectively.
Figure 1B:
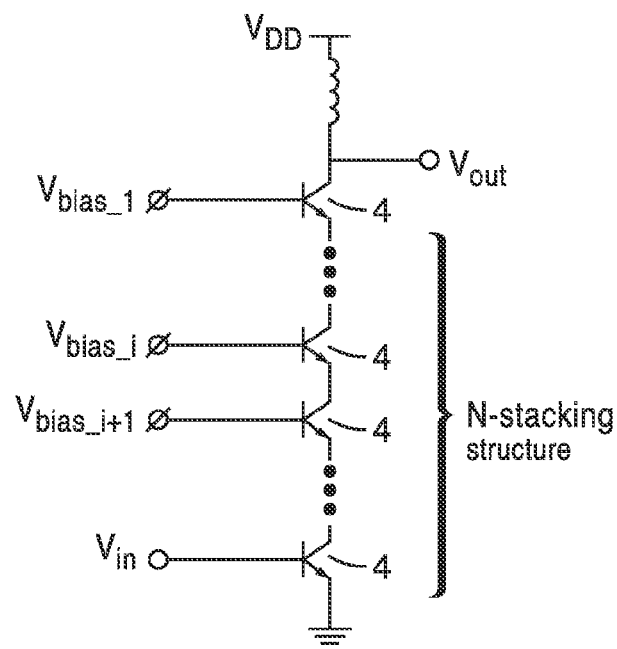

Table 1 gives a comparison of the minimum supply voltage between the conventional cascode structure of FIG. 1a and the origami topology of FIG. 2a for 4-stacked stages 10 in various current CMOS technologies. Note the significant reduction in the required minimum supply voltage using topology of FIG. 2a compared to the prior art topology of FIG. 1a.

TABLE I

| Technologies | 4 stacked cascode stages (following the prior art) | | 4 cascaded origami stages (using the present invention) | |
| --- | --- | --- | --- | --- |
| | Minimum supply voltage | Signal swing | Minimum supply voltage | Signal swing |
| 0.18 µm CMOS ($V_{th}$~0.36 V) | 3.44 V | ±0.5 V | 0.86 V | ±0.5 V |
| 0.13 µm CMOS ($V_{th}$~0.32 V) | 2.88 V | ±0.4 V | 0.72 V | ±0.4 V |
| 90 nm CMOS ($V_{th}$~0.24 V) | 2 V | ±0.26 V | 0.5 V | ±0.26 V |

Figure 3A:
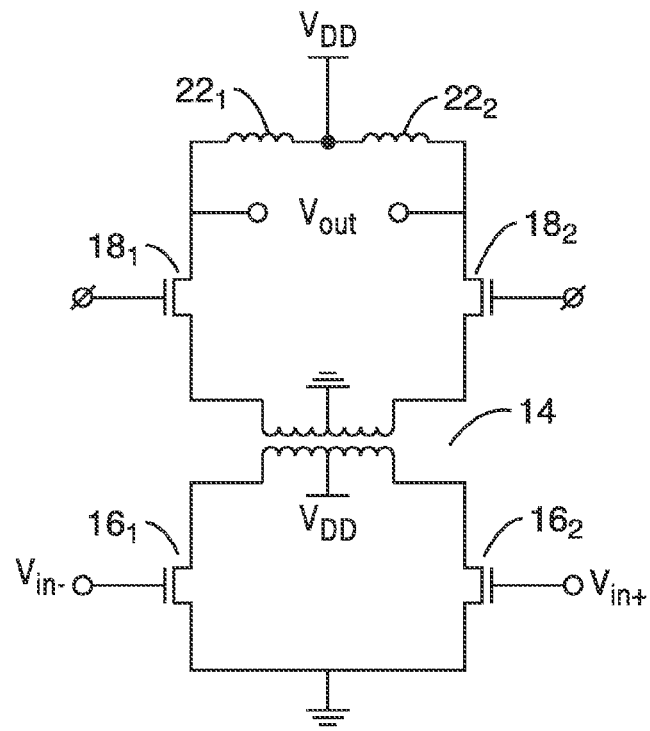
FIG. 3a is a schematic diagram of a MOS Low Noise Amplifier (LNA) using a folded or origami topology as disclosed herein.
Figure 3B:
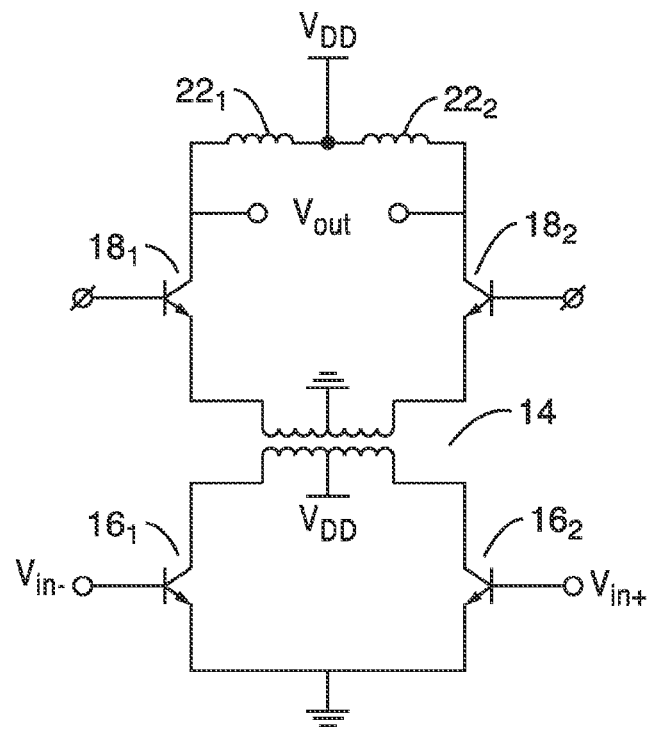
FIG. 3b is a schematic diagram of a bipolar Low Noise Amplifier (LNA) using a folded or origami topology as disclosed herein.
Figure 4A:
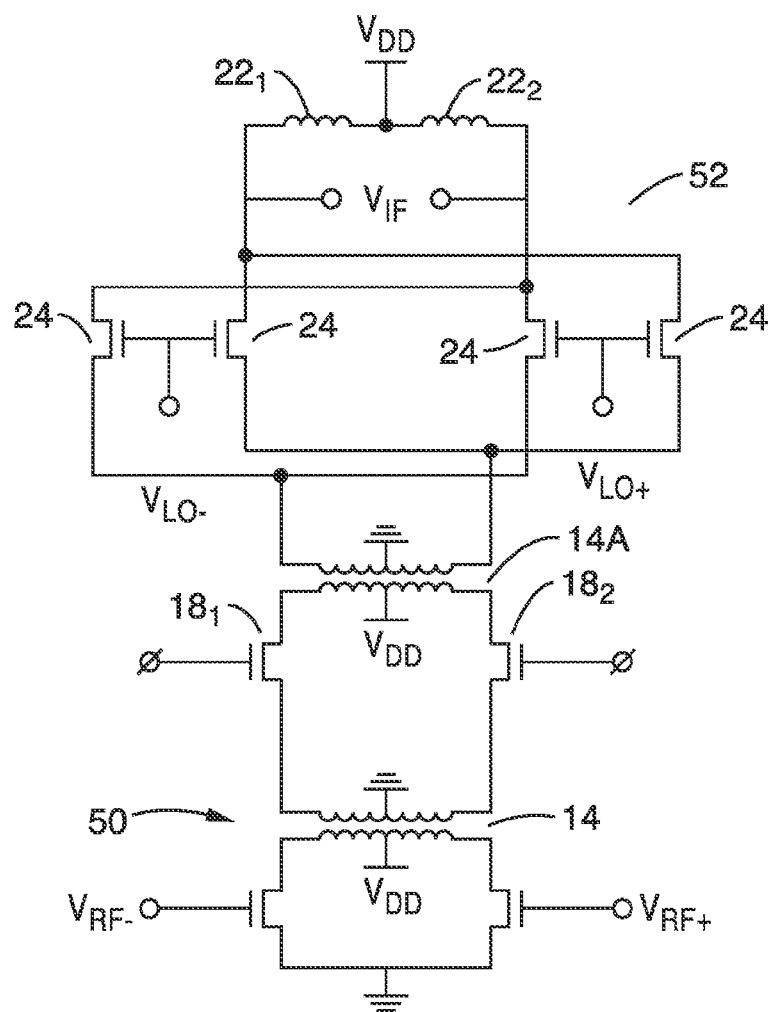
FIG. 4a is a schematic diagram of a combined MOS mixer and LNA using a folded or origami topology as disclosed herein.
Figure 4B:
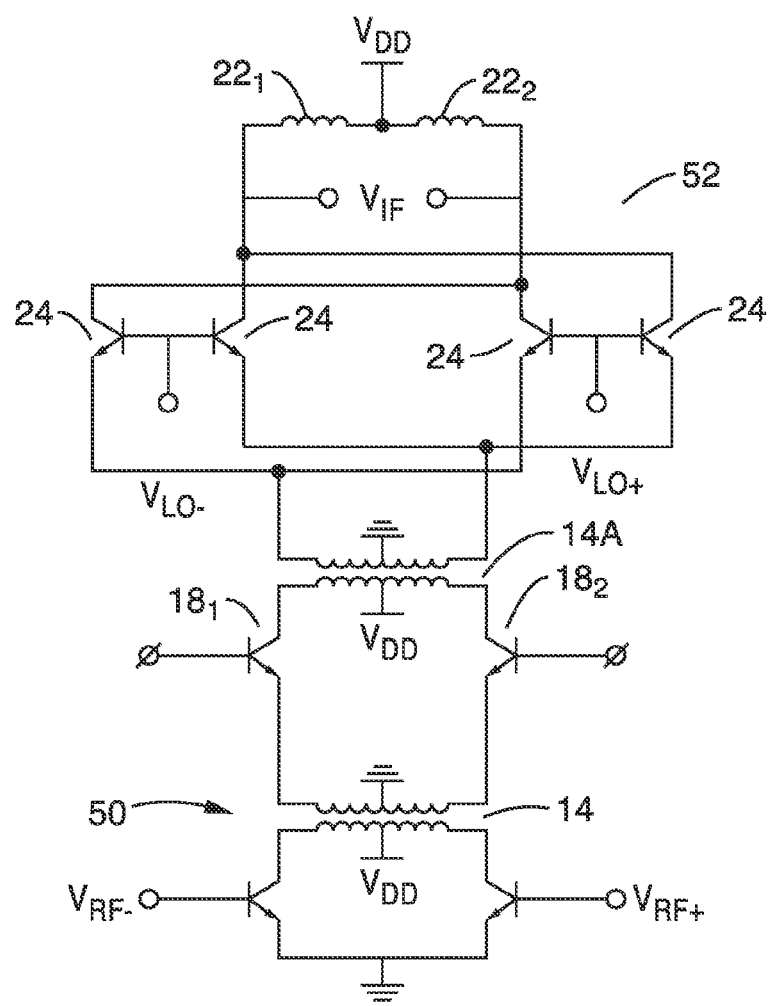
Figure 5A:
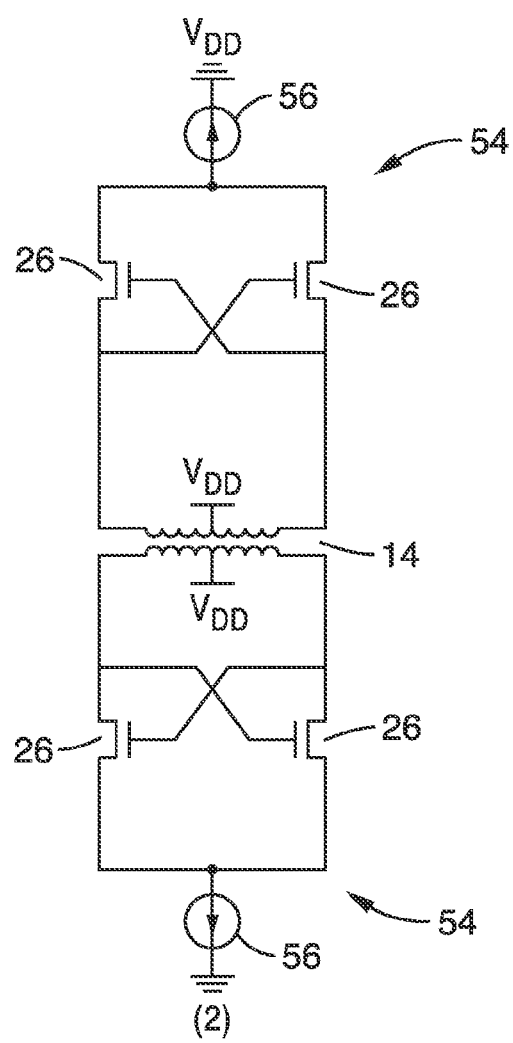
FIG. 5a is a schematic diagram of a MOS Voltage Controlled Oscillator (VCO) using a folded or origami topology as disclosed herein.

Origami topology can be used in many analog and mixed-signal circuit building blocks, such as amplifiers, mixers, oscillators or VCOs and frequency dividers. FIGS. 3a, 4a and 5a give three examples of the origami topology circuits in MOS technology. FIGS. 3b, 4b, and 5b depict their bipolar counterparts, respectively. A schematic diagram of a differential low noise amplifier (LNA) is depicted by FIGS. 3a and 3b while a double balanced mixer is depicted by FIGS. 4a and 4b and coupled VCO pair is depicted by FIGS. 5a and 5b.

Advantages of the presently disclosed design compared top the prior art:

Allows a lower supply voltage, which usually leads to lower power consumption circuits.

Higher signal headroom and better linearity.

Transformers provide extra voltage or current gain.

Transformers also realize impedance conversion or matching. At the input stage, impedance matching allows lower return loss and therefore providing higher signal power delivered to the circuit. At the output stage, transformers increase output impedance of the circuit, providing higher effective gain (see FIG. 4).

Both CMOS and bipolar integrated circuits tend to use lower supply voltage to allow low power consumption. Many analog and mixed-signal circuits employ cascode structures requiring high supply voltage. Origami topology solves this problem by allowing multi-stage circuits to use the lowest supply voltage while providing higher gain.

The circuits of FIGS. 2a-3b are preferably implemented using integrated circuit technologies. As such, the depicted transformers are preferably implemented "on-chip". See, e.g., FIG. 10.

The MOS designs of FIGS. 2a, 3a, 4a and 5a may be CMOS designs, but for higher performance (which typically means higher frequency applications), the use of NMOS devices may well be preferred. The devices may be silicon based or more exotic semiconductor technologies using other semiconductor materials may be alternatively used (typically for higher speed applications than silicon can easily accommodate).

Figure 2C:
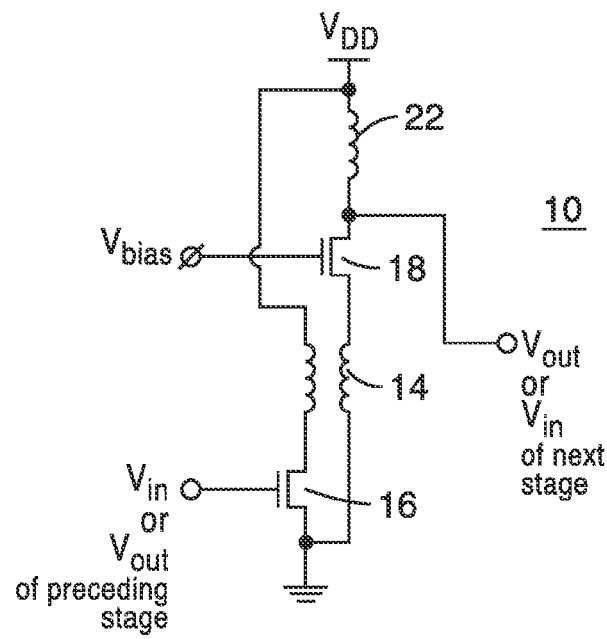
FIGS. 2c and 2d are schematic diagrams of a single stage of the circuits of FIGS. 2a and 2b, respectively.

Turning now to FIG. 2c, a single MOS stage for the embodiment of FIG. 2a is shown. In this embodiment of a stage 10, two transistors 16, 18 and a single transformer 14 are utilized. The AC input voltage $V_{in}$ is applied to a control electrode (gate in the case of MOS transistors) of an input transistor 16, whose current carrying electrodes are coupled across the power supply in series with an inductive load (the primary of transformer 14). A DC bias voltage $V_{bias}$ is applied to a control electrode (gate in the case of MOS transistors) of transistor 18, whose current carrying electrodes are likewise coupled across the power supply in series with an inductive load 22 and with the secondary of transformer 14. The output of the stage is taken at a junction between the secondary of the transformer 14 and transistor 18.

Figure 2D:
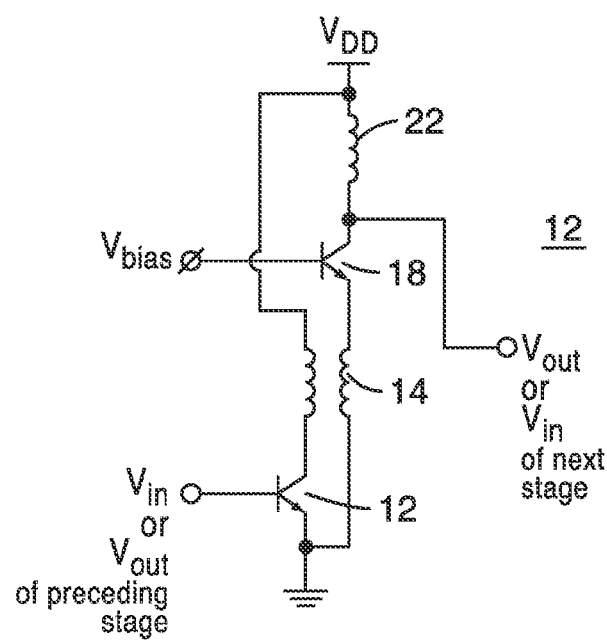

FIG. 2d depicts a single stage 12 of the embodiment of FIG. 2b.

A stage 10 may have additional transistors and transformers. See FIG. 2e. In this embodiment the input still has a single input transistor 16, but multiple transistors 18 (labeled 18-1, 18-2, 18-3 in this embodiment of FIG. 2e). Note that in each case the transistors 16, 18-1, 18-2, 18-3 are each connected across the power supply voltage via inductive loads. The number of transistors 18 have gone from one in the case of the embodiment FIG. 2a to three in this embodiment. Those skilled in the art should appreciate the fact that the number three was arbitrarily selected and could have just as well been two, four, five, or whatever. Moreover, those skilled in the art will recognize that the number of transformers 14 have increased in a corresponding manner. Therefore, they are similarly identified by numbers 14-1, 14-2 and 14-3 in this embodiment. The number of DC bias voltages have also increased similarly.

Figure 2E:
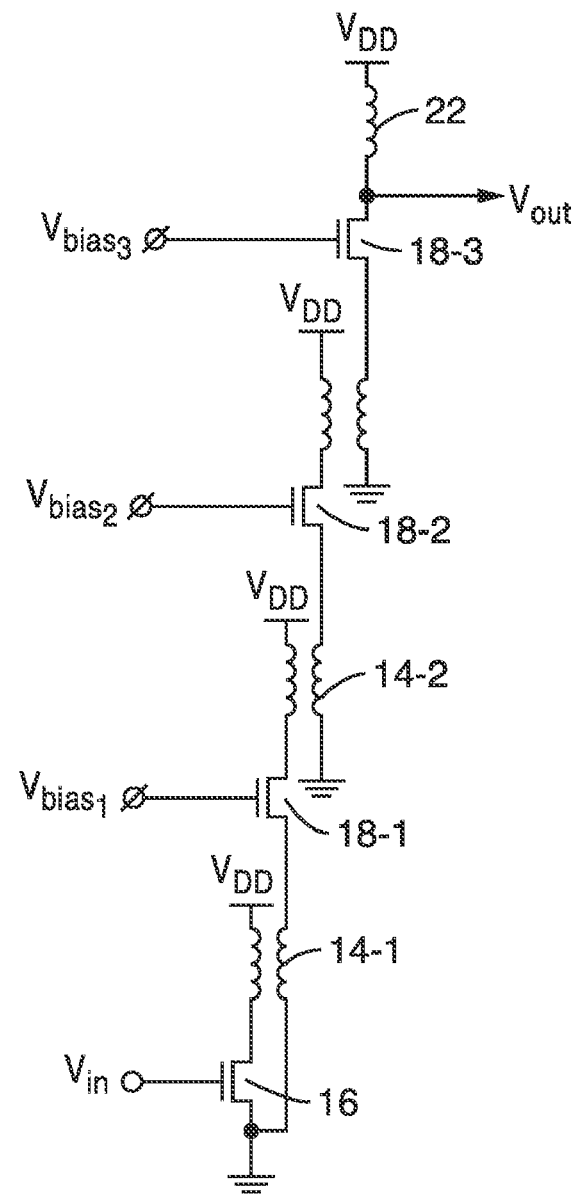
FIG. 2e is a schematic diagram showing how a single stage can have multiple transistors and transformers to thereby increase its gain.

Note that in comparing FIGS. 2e and 2c, the circuit output $V_{out}$ shown in FIG. 2c occurs at the junction between inductor 22 and transistor 18 while in Figure the circuit output $V_{out}$, occurs at the junction between inductor 22 and transistor 18-3. But transistor 18-1 can also be viewed as having an AC output which is coupled inductively to transistor 18-2, and so on for as many transistors as are arranged in the sequence shown in FIG. 4e. Looking at transistor 18-1 alone for the moment, its AC output instead of occurring at the junction between one of its current carrying electrodes and the inductive load, its output is now coupled via the inductive load (the primary of transformer 14-2) itself, so its AC output might be said to be associated with that junction rather than occurring at that junction.

So each stage 10, 12 in the embodiments of FIGS. 2a and 2b have a minimum of one transformer 14, one input transistor 16 and one bias transistor 18, but the number of transformers 14 and bias transistors 18 may be increased to add gain to an individual stage 10, 12 in the manner suggested by FIG. 2e.

As will be seen, each stage 10, 12 can have multiple input transistors 16, so differential amplifier designs are quite feasible. The number of transformers 14 and bias transistors 18 can increase in a similar fashion when differential amplifier designs are considered in the discussion below.

In addition to adding gain by increasing the number of transformers in a stage 10, 12, as shown by FIG. 2e, the gain can also be increased by cascading stages as shown in FIGS. 2a and 2b. A bipolar version of FIG. 2e has not been included since it should now be readily apparent to those skilled in the art to convert the MOS version of FIG. 2e to a bipolar embodiment if desired.

As the number of stages increase, the transistors tend to increase in size as those skilled in the art should appreciate, since larger AC voltage swings must be accommodated. Also, those skilled in the art will appreciate how to adjust the bias potentials on transistors 18 as they increase in size from left to right in FIGS. 2a and 2b and as they are used in the embodiments as well. Generally speaking, the bias voltages are such as to turn on their associated bias transistors 18 without causing those transistors 18 to go into saturation, inasmuch as the disclosed circuits are analog circuits.

It has already been indicated that a stage 10 might well provide a differential (or balanced) amplifier. It was suggested above that the number of transformers 14 might well double in such an embodiment. While that is true, the doubling of the number of transformers can be inhibited by using a center-tapped transformer instead! See the embodiment of FIG. 3a. In this embodiment there are two input transistors $16_1$ and $16_2$, which receive differential (or balanced) inputs $V_{in-}$ and $V_{in+}$, respectively and which transistors are coupled across the power supply via an inductive load (the primary of transformer 14). The center tap of the primary of transformer 14 is coupled to $V_{DD}$, while center tap of the secondary of transformer 14 is coupled to ground in this embodiment. In this embodiment there are two bias transistors $18_1$ and $18_2$, which couple the secondary of transformer 14 to $V_{DD}$ via inductive loads $22_1$ and $22_2$. The polarity of the differential outputs (both identified as $V_{out}$) is not marked as the polarity of the differential outputs will depend on the polarity selected for the secondary winding to the primary winding of transformer 14. Thus dots are not depicted for the windings (to indicate polarity), since the polarity selected will be depend on the desired polarities of the $V_{out}$ outputs. FIG. 3a shows a MOS embodiment, while FIG. 3b shows a corresponding bipolar embodiment.

Figure 9A:
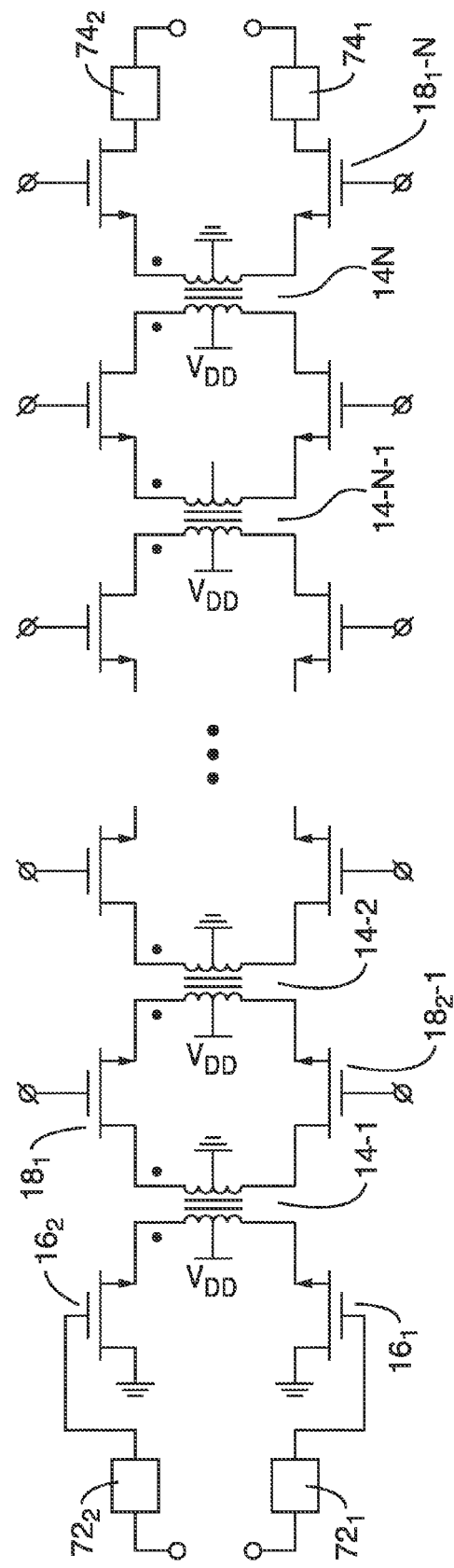
FIG. 9a is a schematic diagram of a power amplifier of the type described with reference to FIGS. 8a and 8b, but with additional stages.

Just as in the case of the embodiment of FIG. 2a, the number of stages can be increased for the embodiment of FIG. 3a (see, for example, the embodiment of FIG. 9a discussed subsequently) and the number of bias transistors 18 and transformers 14 can be increased in a single stage.

FIG. 4a shows a differential CMOS mixer and LNA combination. The inputs to the mixer 52 are $V_{LO-}$ and $V_{LO+}$ from a local oscillator (not shown) and $V_{RF-}$ and $V_{RF+}$ from the antenna or filter. $V_{RF-}$ and $V_{RF+}$ are applied to differential inputs of a differential amplifier 50 of the type also shown in FIG. 3a. The AC outputs of the differential amplifier 50, instead of being directly coupled as shown in the embodiment of FIG. 3a, are coupled inductively via a transformer 14A. Note that transformer 14A (in combination transformer 14) plays the same role as previously discussed with respect to the FIG. 3a in allowing the two bias transistors $18_1$ and $18_2$ to be coupled across the power supply voltage ($V_{DD}$ to ground in this embodiment) via inductive loads (the portions of the windings of transformers 14 and 14A coupling them to the power supply).

In the mixer 52 the transistors 24 are similarly coupled across the power supply voltage ($V_{DD}$ to ground in this embodiment) via inductive loads (the portions of the windings of transformer 18A and inductive loads $22_1$ and $22_2$ coupling them to the power supply). The differential output of the mixer occurs at $V_{LO-}$ and $V_{LO+}$ and the sign (plus or minus) of the differential outputs is a function of the polarities of the transformers 14 and 14A and thus can be varied as desired.

FIG. 4b is a bipolar implementation of the circuit of FIG. 4a and its functioning should be easy to follow for those skilled in the art based upon the foregoing description and therefore will not be further discussed herein.

FIG. 5a is a schematic diagram of two symmetrical VCOs 54 implemented using the disclosed origami topology. The two transistors 26 in each VCO 54 are cross coupled in a typical oscillating configuration. But note how the two VCOs are connected by a center-tapped transformer 14. VCOs 54 are coupled together through the transformer 14. The transformer 14 thus serves as both a coupler and a (loading) resonator, effectively acting as a bandpass filter.

In this embodiment, current sources 56 are shown as opposed to showing a power supply per se. But, as in the previous embodiments, the transistors are directly coupled to a source of power via an inductive load (provided by the transformer 14) and the transformer plays a role in determining the frequency of oscillation.

The disclosed techniques can also be used in connection with a power amplifier of the type which might be used in a transmitter for a communications device, such as a telephone or a transmitting dish antenna. The disclosed transformer based ("origami") inphase power amplifier is a unique low-voltage solution that offers increased output power versus conventional methods. This circuit is critical in the design of transmitting true wideband data at 60 GHz using a low-cost CMOS technology.

Figure 6A:
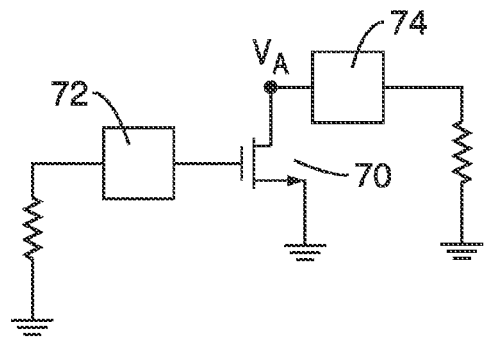
Figure 6B:
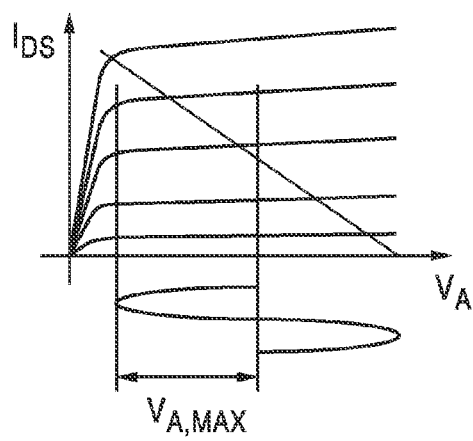
Figure 6C:
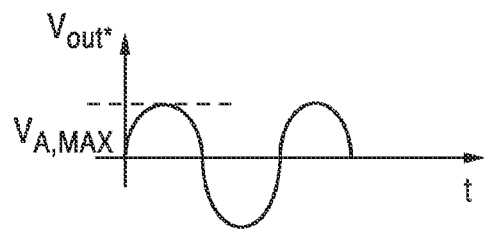

FIGS. 6a-6c show a prior art power amplifier. The schematic diagram of FIG. 6a includes a power transistor 70 with impedance matching networks 72 and 74 at its input and output, respectively. FIGS. 6b and 6c show the transistor characteristics. The transistor 70 is typically a Gallium Arsenide (GaAs) or Indium Phosphide (InP) HEMT, such devices tend to be expensive and require a higher than usual supply voltage. The transistor 70 is limited in how much power is delivered by its size. Both large current and voltage swings are required as shown in FIGS. 6b and 6c. The maximum voltage swing is identified as $V_{A,MAX}$.

Figure 7A:
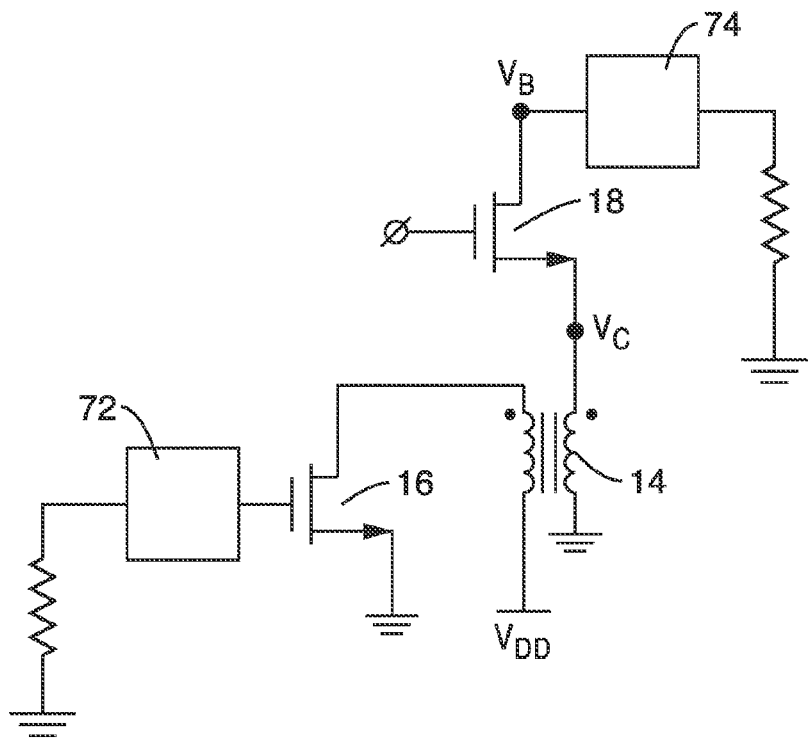
FIG. 7a is a schematic diagrams of a MOS PA using a folded or origami topology as disclosed herein.
Figure 7B:
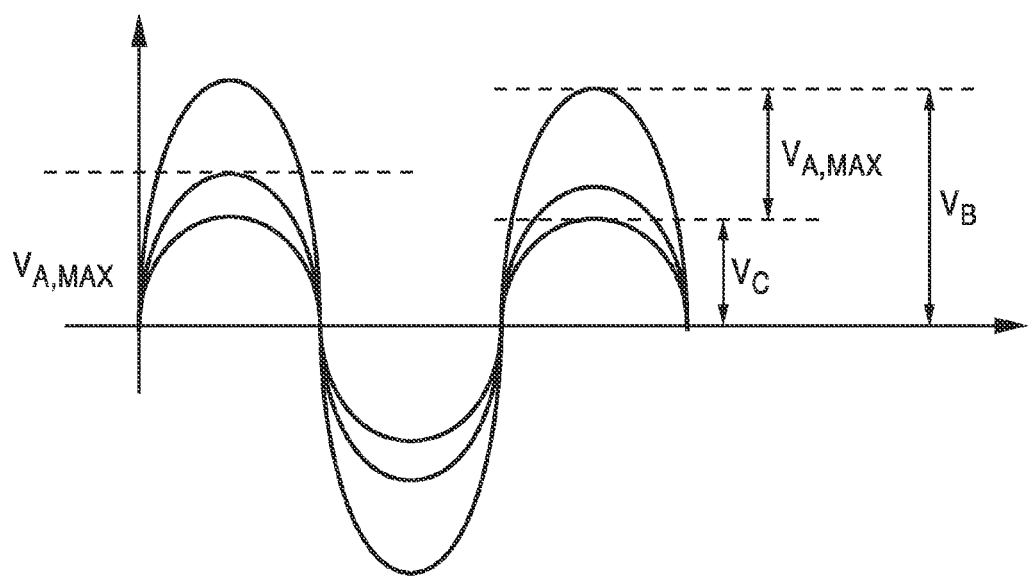

Applying the origami topology principles discussed above to a prior art power amplifier of the type just discussed results in a new circuit where the output voltage is allowed to increase by 2-3 dB via in-phase combining with the use of a transformer in a cascode design. See the schematic diagram of FIG. 7a and the graph of FIG. 7b. It should be apparent that the schematic diagram of FIG. 7a is very similar to that of FIG. 2c. Indeed, it is sufficiently similar that the input transistor 16, bias transistor 18 and transformer 14 are all identified by the same reference numerals. However, being a power amplifier, the embodiment of FIG. 7a also has impedance matching networks 72 and 74, which are often important in power amplifier to help ensure that power generated in the circuit is effectively delivered from the circuit to a downstream load (usually an antenna). Otherwise the circuit overheats and the transistors end up having a vert short life expectancy.

The schematic of FIG. 7a identifies two voltage points: $V_B$ and $V_C$. These voltage points are in-phase which allows the voltage at $V_C$ to exceed $V_{A,MAX}$ without violating the maximum voltage across the bias transistor 18. In other words, the drain-to-source voltages, $V_{DS}$, of each device 16, 18 reach the maximum, but the overall voltage referenced to ground is twice as large. This circuit can provide an effective low-voltage solution because the transformer 14 allows each device 16, 18 to have the same supply voltage of, for example, only 1.1 V Of course, the supply voltage is a matter of design choice, but by reducing the needed supply voltage to below that required for conventional HMET devices, the design of the power supply to be used in a transmitting device can be significantly simplified.

Figure 7C:
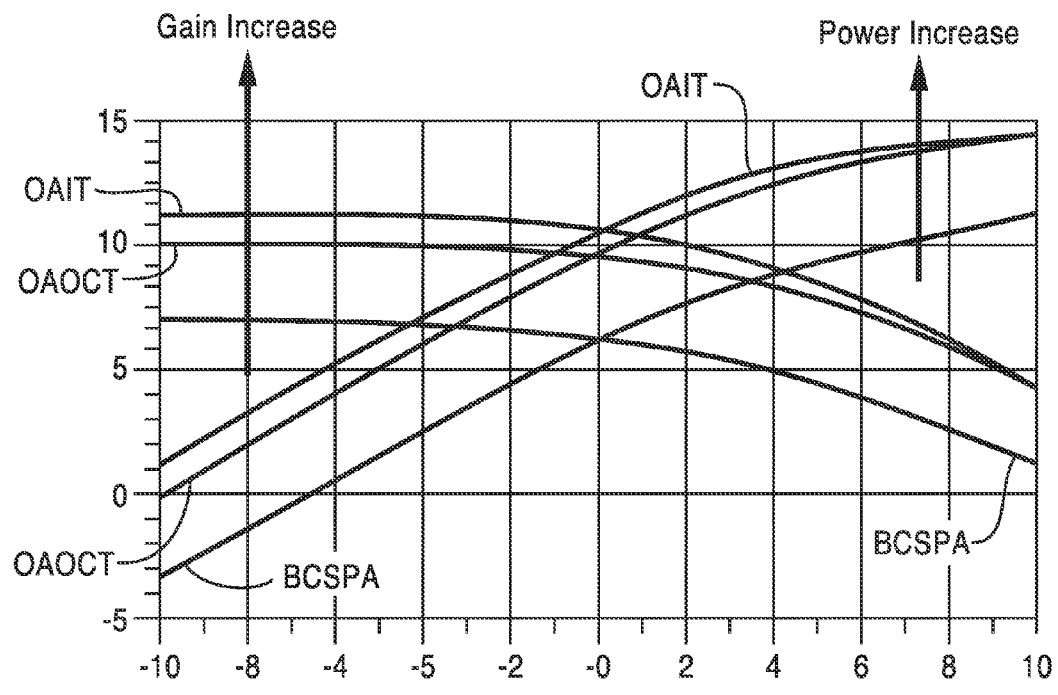
FIG. 7c is a graph of power increases and gain increases using the disclosed techniques compared to following the teachings of the prior art according to computer simulations.

Computer simulation results are shown in FIG. 7c for the origami power amplifier of FIG. 7a using the UMC 0.13 um CMOS process at 60 GHz. In this figure, "OAIT" identifies the results for an origami amplifier with an ideal transformer, while "OAOCT" identifies the results for an origami amplifier with CMOS on-chip transformer and "BCSPA" identifies the results for a baseline common-source power amplifier in the simulation.

Figure 7D:
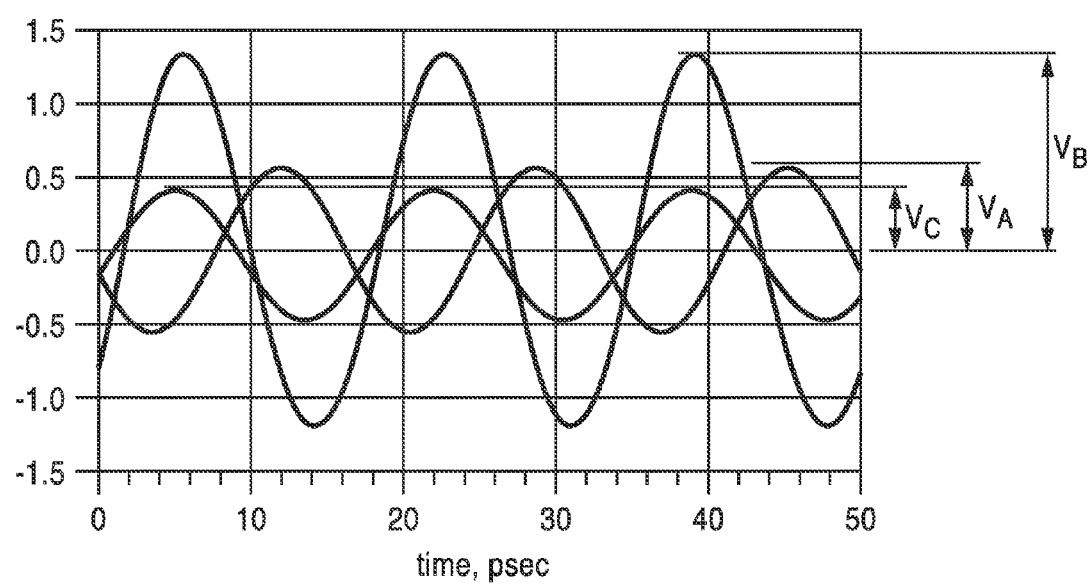

FIG. 7d depict time-domain voltage waveforms show the increase in voltage $V_B$ as predicted by the theory presented above.

Figure 8A:
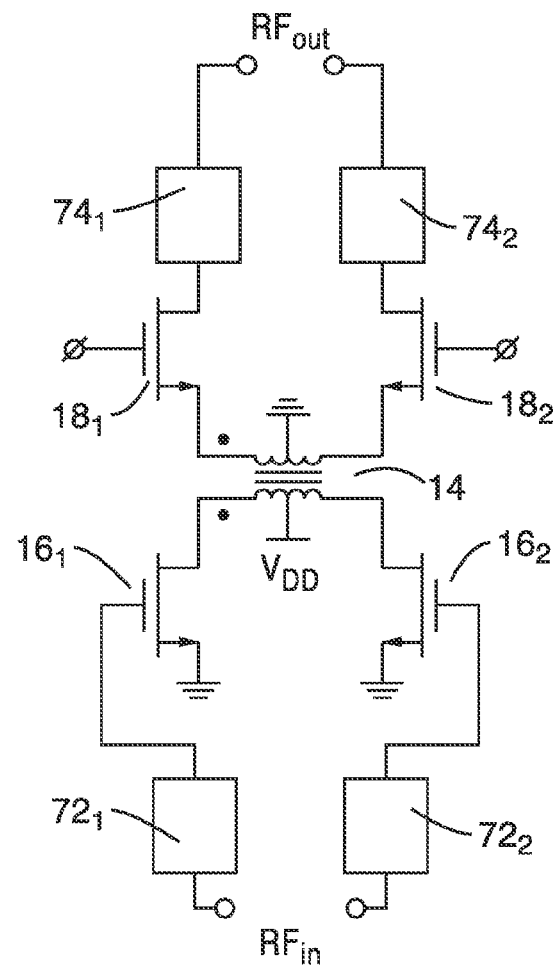
Figure 8B:
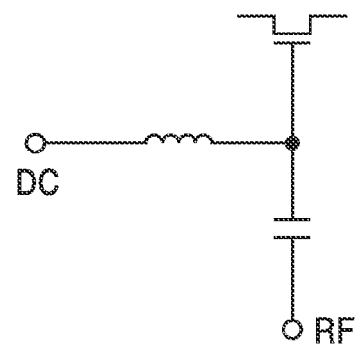
FIG. 8b shows one possible embodiment of a bias-T which can form part of or all of an impedance matching network.

A differential version of the power amplifier of FIG. 7a is shown in FIG. 8a. The similarity to the differential amplifier FIG. 3a should be apparent. The big difference is the presence of the impedance matching networks $72_1$, $72_2$, $74_1$ and $74_2$, which are often utilized in power amplifiers to effectively get the power out of the circuit and into a load (usually a downstream antenna in a communication application). The impedance matching networks can assume a number of possible designs as those skilled in the art of designing communication transmitters are quite familiar. A simple matching network could well be an LC network of the type shown in FIG. 8*b* or it could be a more complicated design. In any event, the LC network should have a means for supplying DC to bias transistors $18_1$ and $18_2$. In the matching network of FIG. 8*b* DC from the power supply is coupled via the inductor shown in FIG. 8*b* to bias transistors $18_1$ and $18_2$, while the AC generated by the circuit (which can be at a frequency as high as 60 GHz if not higher still) is tapped off by the capacitor depicted in FIG. 8*b*. Note that the "origami" topology can still be seen in FIGS. 8*a* and 8*b*. Bias transistors $18_1$ and $18_2$ can "see" the full power supply voltage via inductive loads (via the center-tapped secondary of transformer 14 and the inductors of FIG. 8*b*). Similarly, input transistors $18_1$ and $18_2$ can also "see" the full power supply voltage via inductive loads (via the center-tapped primary of transformer 14).

Figure 9B:
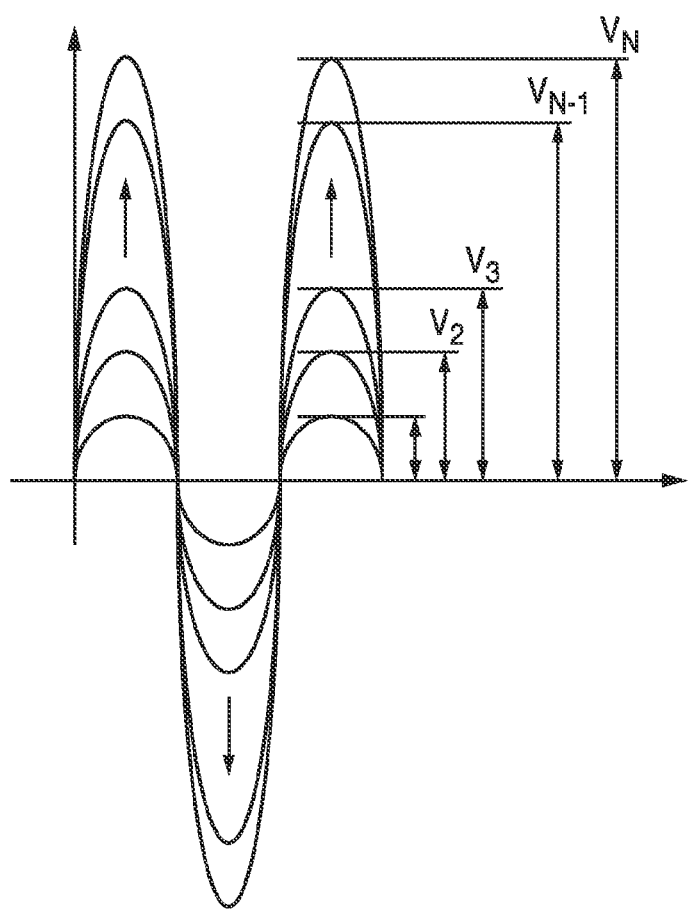

Both the differential version of the power amplifier and the non-differential version can be implemented having multiple stages much like the multiple stage low-signal amplifier of FIG. 2*a*. See FIG. 9*a* which shows a power amplifier of the type described with reference to FIGS. 8*a* and 8*b*, but with additional stages. FIG. 9*b* is a graph showing gains occurring stage by stage.

At least a single transformer 14 having a primary and a secondary winding appears in each of the disclosed embodiments. The disclosed circuits are preferably made as integrated circuits. On-chip transformers are known in the art. In the disclosed embodiments the winding ratio typically runs from about 1:1 to perhaps 1:10. An on-chip transformer can be easily made. See FIG. 10*a* which shows a transformer 14 having a 1:1 winding ratio. The primary comprises a single loop 80, and similarly the secondary comprises a single loop 82. The two loops 80, 82 are separated preferably using conventional insulating materials employed during chip manufacture. If the disclosed circuits are used at very high frequencies (>20 GHz), then the transformer loops can be very small indeed and can be implemented as an on-chip transformer. At lower frequencies, the disclosed circuits can still be made and used, but the transformer tends to increase in size making it more difficult to implement on chip, so the transformers at some point (as the desired frequency of the circuit decreases) may have to be implemented as discrete devices off-chip.

Figure 10A:
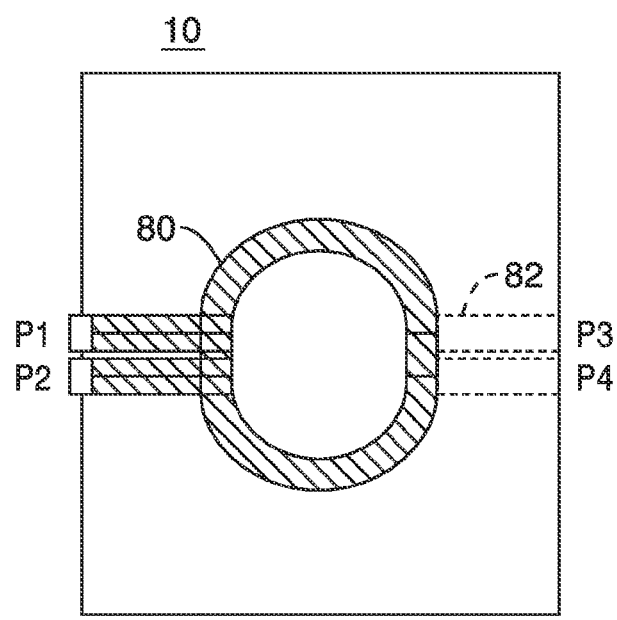
FIG. 10a shows one possible embodiment of an on-chip transformer.
Figure 10B:
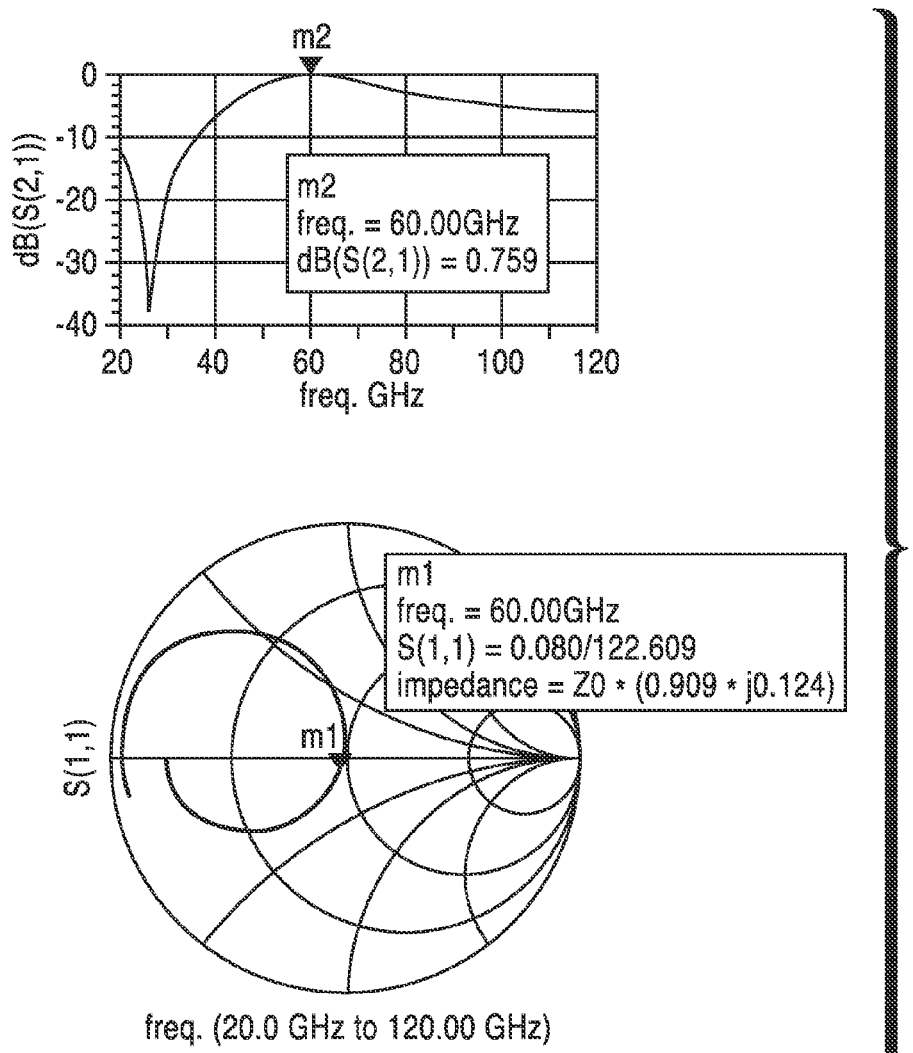

The depicted transformer 14 of FIG. 10*a* with a 1:1 winding ratio is particularly good for a power amplifier at very high frequencies (say, 60 GHz) since the metal winding is relatively wide (to carry high current) and a 1:1 turn ratio transformer yields a high coupling coefficient. For lower frequency applications (for use in 1.8 GHz, 2.4 GHz or 5 GHz cell phone and wireless LAN applications) both LNAs or PAs circuits tend to call for small transformers 14 with a higher turns ratio (say 1:10). See a related PCT patent application entitled "Interleaved Three-Dimensional On-Chip Differential Inductors and Transformers" for additional information regarding how such transformers may be built on-chip. FIG. 10*b* describes the S-parameters of the transformer of FIG. 10*a*. The rectangular graph plots the S(2,1) (forward transmission coefficient) which shows low loss (−0.759 dB at 60 GHz). The circular graph gives the S(1,1) (input matching) on a Smith chart which shows a good 500 hm match.

The disclosed origami technique provides for the coupling circuits and includes (i) providing a power supply; (ii) providing a plurality of transistors which are inductively coupled to the power supply for providing a single DC supply voltage directly to each of the plurality of transistors, and providing a plurality of transformers having primary and secondary windings, the primary and secondary winding providing, at least in part, inductive loads for inductively coupling the plurality of transistors to said power supply, the plurality of transformers also providing an AC signal path for coupling neighboring ones of the plurality of transistors together.

This technique allows coupled circuits to be designed having a power supply and a plurality of transistors and a plurality of transformers, wherein the plurality of transistors are inductively coupled directly to the power supply for providing a single (or a minimum of) DC supply voltage(s) directly to each of the plurality of transistors, and wherein the plurality of transformers have primary and secondary windings, the primary and secondary windings providing, at least in part, inductive loads for inductively coupling the plurality of transistors to the power supply, the plurality of transformers also providing an AC signal path for coupling neighboring ones of the plurality of transistors together.

Several embodiments of circuits utilizing this technique have been disclosed. However, it should now be evident that the technique can most likely be applied to a wider array of circuits than those discussed herein and to more embodiments than those described herein. As such the particular circuits disclosed herein are basically food for thought and it is believed that once the disclosed techniques are understood by those skilled in the art that other circuits using the techniques disclosed herein with be created based thereon. As such the invention is not to be limited to the specific embodiments disclosed herein except as specifically required by the appended claims.

What is claimed is:

1. A cascode arrangement of transistors comprising: N stages, where N>1 and where each stage comprises:
   (i) a first transistor and a plurality of second transistors, each transistor of said first transistor and said plurality of second transistors having a control electrode and two current carrying electrodes, the control electrode of said first transistor being coupled to a circuit input for a first stage or to an output of a preceding stage in the path of at least one of said plurality of second transistors for any subsequent stages and the control electrode of the at least one of said plurality of second transistors being coupled to a bias voltage, and
   (ii) at least one transformer having a primary winding and a secondary winding, a first current carrying electrode of said first transistor being coupled to a first power supply source via the primary winding of the transformer, a second current carrying electrode of said first transistor being coupled to a second power supply source, and a second current carrying electrode of the at least one of said plurality of second transistors being coupled to a second power supply source via the secondary winding of the transformer, a first current carrying electrode of the at least one of said plurality of second transistors being coupled to said first power supply source via an inductive load and providing the output for either a succeeding stage or a circuit output for a final stage of said N stages;
   (iii) wherein each one of the control electrodes of said plurality of second transistors is coupled to a different bias voltage; and
   (iv) wherein at least one of said plurality of second transistors is transformer coupled to said first transistor and the remaining of said plurality of second transistors have associated transformers for interconnection to another one of said plurality of second transistors.

2. The cascode arrangement of claim 1, wherein said transistors are bipolar transistors.

3. The cascode arrangement of claim 1, wherein said transistors are MOS transistors.

4. The cascode arrangement of claim 1, wherein said inductive load comprises an inductor.

5. The cascode arrangement of claim 1, wherein the at least one transformer has a turns ratio in the range to 1:1 to 1:10.

6. An analog amplifier comprising:
at least two amplification groups;
at least one transformer, within each amplification group, having primary and secondary windings;
at least one first transistor, within each amplification group, having current carrying electrodes coupled to a first potential of a power supply via at least a portion of the primary winding of said at least one transformer and to a second potential of the power supply, a control electrode of said at least one first transistor being coupled to an amplifier input, and
at least one second transistor, within each amplification group, having current carrying electrodes coupled to the second potential of the power supply via the at least a portion of the secondary winding of said at least one transformer and to the first potential of the power supply via a load, a control electrode of said at least one second transistor being coupled to a DC bias voltage to thereby bias said at least one second transistor on, but not in saturation,
an amplifier output occurring at or in association with a junction between one of said current carrying electrodes of said at least one second transistor and said load;
wherein said amplifier output of each amplification group is coupled to the control electrode of said first transistor in the following amplification group;
wherein said load comprises an inductor that is a primary winding of another transformer of a successive amplification group; and
wherein said amplifier output of each amplification group is coupled to its successive amplification group via said another transformer.

7. The analog amplifier of claim 6, wherein said transistors are bipolar transistors.

8. The analog amplifier of claim 6, wherein said transistors are MOS transistors.

9. The analog amplifier of claim 6, wherein the at least one transformer has a turns ratio in the range to 1:1 to 1:10.

10. An amplifier comprising:
a center-tapped transformer with a center-tapped primary and a center-tapped secondary, the center-tapped primary being coupled to a first potential of a power supply and the center-tapped secondary being coupled to a second potential of the power supply;
a first pair of transistors having current carrying electrodes coupled to the center-tapped primary of said transformer and to the second potential of the power supply, control electrodes of said first pair of transistors being coupled to amplifier inputs,
a second pair of transistors within a first stage having current carrying electrodes coupled to the center-tapped secondary of said center-tapped transformer and to the first potential of the power supply via a first load, control electrodes of said second pair of transistors being coupled to a bias voltage for biasing said second pair of transistors into conduction,
at least a second center-tapped transformer and a third pair of transistors, within at least a second stage of the amplifier, in which current carrying electrodes of the third pair of transistors are coupled to a secondary of said second center-tapped transformer and to the first potential of said power supply via at least a second load, control electrodes of said third pair of transistors being coupled to another bias voltage for biasing said third pair of transistors into conduction;
wherein said first load comprises the primary of said second center-tapped transformer;
wherein said amplifier has any desired number of stages interconnected in the manner of said first stage and said second stage; and
an amplifier output occurring at or in association with a common junction between current carrying electrodes of a pair of transistors and a load within the last of said desired number of stages.

11. The amplifier of claim 10, wherein the transistors are all MOS transistors.

12. The amplifier of claim 10, wherein the load is inductive.

13. The amplifier of claim 10 in combination with a mixer, wherein the mixer is coupled to the amplifier via a second center-tapped transformer, the second center-tapped transformer having a center-tapped primary and a center-tapped secondary, the center-tapped secondary being coupled to the second potential of the power supply and the center-tapped primary being coupled to the first potential of the power supply, the center-tapped primary of said second center-tapped transformer acting as said load.

14. The amplifier and mixer combination of claim 13, wherein the mixer comprises:
two pairs of parallel coupled transistors, each of said pairs of parallel coupled transistors coupling the center-tapped secondary of said second center-tapped transformer and said power supply via said load, with control electrodes of said pairs of parallel coupled transistors being cross coupled so that the control electrodes of the transistors of one pair are cross connected to the control electrodes of the transistors of the other pair.

15. An amplifier, comprising:
a center-tapped transformer with a center-tapped primary and a center-tapped secondary, the center-tapped primary being coupled to a first potential of a power supply and the center-tapped secondary being coupled to a second potential of the power supply;
a first pair of transistors having current carrying electrodes coupled to the center-tapped primary of said center-tapped transformer and to the second potential of the power supply, control electrodes of said first pair of transistors being coupled to amplifier inputs,
a second pair of transistors having current carrying electrodes coupled to the center-tapped secondary of said center-tapped transformer and to the first potential of the power supply via a load, control electrodes of said second pair of transistors being coupled to a bias voltage for biasing said second pair of transistors into conduction,
an amplifier output occurring at or in association with a common junction between current carrying electrodes of said second pair of transistors and said load; and
a mixer coupled a second center-tapped transformer having a center-tapped primary and a center-tapped secondary, the center-tapped secondary of said second center-tapped transformer being coupled to the second potential of the power supply and the center-tapped primary of said second center-tapped transformer being coupled to the first potential of the power supply, the center-tapped primary of said second center-tapped transformer acting as said load.

16. An amplifier as recited in claim 15, wherein the mixer comprises two pairs of parallel coupled transistors, each of said pairs of parallel coupled transistors coupling the center-tapped secondary of said second center-tapped transformer to said power supply via second load, with control electrodes of said pairs of parallel coupled transistors being cross coupled so that the control electrodes of the transistors of one pair are cross connected to the control electrodes of the transistors of the other pair.

* * * * *